United States Patent
Schürz

(10) Patent No.: US 7,042,139 B2
(45) Date of Patent: May 9, 2006

(54) PIEZOSTACK AND METHOD FOR PRODUCING A PIEZOSTACK

(75) Inventor: Willibald Schürz, Pielenhofen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/918,914

(22) Filed: Aug. 16, 2004

(65) Prior Publication Data

US 2005/0018378 A1    Jan. 27, 2005

Related U.S. Application Data

(63) Continuation of application No. PCT/DE03/00305, filed on Feb. 4, 2003.

(30) Foreign Application Priority Data

Feb. 21, 2002   (DE) ................... 102 07 292

(51) Int. Cl.
  *H10L 41/09*   (2006.01)
  *H10L 41/083*  (2006.01)
  *H10L 41/047*  (2006.01)

(52) U.S. Cl. ..................... 310/328; 310/366

(58) Field of Classification Search ........ 310/363–366, 310/328, 320; 29/25.35; H01L 41/083, H01L 41/047, 41/09
See application file for complete search history.

(56) References Cited

U.S. PATENT DOCUMENTS

| 6,236,146 | B1* | 5/2001  | Cramer et al. .......... 310/366 |
| 6,257,700 | B1* | 7/2001  | Aihara et al. ........... 347/44  |
| 6,476,336 | B1* | 11/2002 | Takeuchi et al. ........ 310/328 |

FOREIGN PATENT DOCUMENTS

| DE | 196 46 676 C1 | 4/1998 |
| DE | 199 51 118 A1 | 11/2000 |
| DE | 100 42 893 A1 | 4/2001 |
| DE | 199 28 177 C2 | 4/2001 |
| DE | 199 45 933 C1 | 5/2001 |
| DE | 198 60 001 C1 | 10/2001 |

* cited by examiner

*Primary Examiner*—Darren Schuberg
*Assistant Examiner*—Karen Addison
(74) *Attorney, Agent, or Firm*—Baker Botts L.L.P.

(57) ABSTRACT

In a method for producing a piezostack the asymmetry of the electrically inactive zones (2, 2.1, 2.2) in a piezostack (5) having electrically inactive zones (2, 2.1. 2.2) on a plurality of sides thereof is determined, and the electrically inactive zone with an oversize is then reduced until the asymmetry reaches an acceptable proportion.

10 Claims, 1 Drawing Sheet

US 7,042,139 B2

PIEZOSTACK AND METHOD FOR PRODUCING A PIEZOSTACK

CROSS REFERENCE TO RELATED APPLICATION

This application is a continuation of copending International Application No. PCT/DE03/00305 filed Feb. 4, 2003 which designates the United States, and claims priority to German application no. 102 07 292.2 filed Feb. 21, 2002.

TECHNICAL FIELD OF THE INVENTION

This invention relates to a piezostack and a method for producing a piezostack, as can be used for example for actuators for driving fuel injectors in motor and automotive engineering.

DESCRIPTION OF THE RELATED ART

Previously known multilayer piezoactuators have been produced in a manufacturing process essentially featuring the following steps. In a first step a foil is produced, which is printed in a second step, stacked in a third step and in a fourth step pressed into a wafer or a block typically measuring 10×10 cm. In a fifth step the wafer is split up into a number of 5 mm-wide piezostacks for example. The separation can typically be done by sawing. The piezostacks are then released in a sixth step. This means that a binder in the form of synthetic resin with which the ceramic power was mixed and processed into foils is expelled again. In a seventh step the piezostacks are sintered and in an eighth step they are ground. In a ninth step the piezostacks are metallized, which means that they are provided with an external conductor for electrical contacting, a tenth step features burning in, an eleventh step soldering of the external contacting, a twelfth step encapsulation, a thirteenth step installation in a housing and a fourteenth step electrical polarization.

The outer electrodes, two as a rule, extend over the lengthwise side of the piezostack and lie diagonally opposite one another. To prevent each inner electrode coming into electrical contact with each outer electrode there are electrically inactive zones in each layer of the piezostack, also lying diagonally opposite one another.

A corresponding basic structure of a multilayer ceramic actuator is shown in FIG. 1. The individual ceramic layers 7 are separated from one another by metallic inner electrodes 3, with layer thicknesses of just a few μm. The electrically inactive zones 2.1 and 2.2 of the inner electrodes 3, which are arranged in this embodiment diagonally opposite one another in the outer area of the piezostack 5 enable an outer metallization 1 in the area of the inactive zones 2, to be used to apply the inner electrodes 3 alternately to different electrical potential. The electrical charges brought into the piezoactuator when this is done cause the length of the piezoactuator to change.

To achieve a pure length change of the piezoactuator without distortion along the longitudinal axis 6 it is necessary for the electrically inactive zones 2 to differ only within very narrow tolerances in their size and their position. The distortion of the piezostack 5 is especially marked when the electrically inactive zones 2 of one side differ markedly in size from the electrically inactive zones of the opposite side.

To keep the distortion of the piezostack 5 within a permitted limit the tolerance requirements on the size and the position of the electrically inactive zones are so high that it has not been previously possible to achieve them safely by using a low-cost process.

One option of avoiding the problem of distortion of the piezostack during a change of length is to compensate for the distortion. This is done by putting the piezostack on a membrane which forms a radial support around the piezoactuator housing. This type of guidance avoids any lateral deflection. This embodiment does not however eliminate the distortion of the piezostack and also has the disadvantage of taking up more space because of the membrane.

SUMMARY OF THE INVENTION

The object of the invention is thus to specify a method for producing a piezostack in which the piezostack produced according to this method will distort less when it changes its length than has previously been the case.

The method in accordance with the invention for producing a piezostack also has the advantage that the piezostack produced in accordance with this method takes up less space than the embodiment previously described.

The object is achieved a method for producing a piezostack, comprising the steps of determining, for a piezostack with electrically inactive zones arranged on multiple sides of the piezostack, the asymmetry of the electrically inactive zones, and reducing the electrically inactive zone with oversize to a suitable proportion of the asymmetry.

To determine the asymmetry of the electrically inactive zones the electrically inactive zones can be measured. To determine the asymmetry, the width of the electrically inactive zones can be taken into account. The measurement can be undertaken using an optical measurement process. Digital image processing can be employed for the optical measurement process. The reduction of the electrically inactive zones can be undertaken by grinding off the electrically inactive zones. The edge of the piezostack on which the electrically inactive zones of the piezostack are located can be ground off. The reduction of the electrically inactive zones may create a chamfer wherein the chamfer angle can be set. Over the length of the edge of the piezostack the chamfer can be created with a specific profile. External metallizations can be applied to the piezostack to alternately connect consecutive electrically active zones to each other.

The object can also be achieved by a piezostack, in which electrically inactive zones are present on multiple sides, wherein to unify the sizes of the electrically inactive zones a chamfer is provided along one side of the piezostack in the area of the electrically inactive zones.

The chamfer over the length of the piezostack may feature a profile which is dependent on the oversize of the electrically inactive zones. The chamfer may have a predefined angle. External metallizations can be applied to the piezostack to alternately connect consecutive electrically active zones to each other.

The method in accordance with the invention for producing a piezostack features the following steps. For a piezostack with electrically inactive zones arranged on a number of sides of the piezostack the asymmetry of the electrically inactive zones is first determined. Subsequently the electrically inactive zones with an oversize are then reduced until the asymmetry reaches an acceptable proportion.

The piezostack according to the invention features electrically inactive zones on a number of sides. To unify the sizes of the electrically inactive zones a chamfer is provided along the piezostack in the area of the electrically inactive zones with oversize.

In the further development the inactive zones are measured to determine the asymmetry of the electrically inactive zones.

Advantageously dimensions which are employed to determine the asymmetry are the widths of the electrically inactive zones.

In a further embodiment measurement is undertaken using an optical measurement process.

It is of advantage for digital image processing to be employed in the optical measurement process. This allows the asymmetry of the electrically inactive zones to be determined quickly, safely and while retaining the same quality.

The number of inactive zones can be reduced by grinding them off.

With a further embodiment of the invention the edge of the piezostack in which the electrically inactive zones of the piezostack are located is ground away.

In a further embodiment of the invention a chamfer is created by reducing the electrically inactive zones.

Advantageously the angle of the chamfer can be selected. This allows both the one side and the other side of the electrically inactive zones which feature the oversize to be adapted to the proportion of the inactive zones opposite them.

In addition it is of advantage for the chamfer to be able to be created with a specific profile over the length of the edge of the piezostack. Using this method it is possible to avoid an irregularly distributed asymmetry of the electrically inactive zones over the length of the piezostack.

In a further development an external metallization is applied to the piezostack in order to interconnect the electrically active zones.

Finally, with an advantageous embodiment of the inventive piezoactuator a chamfer over the length of the piezostack features a profile which depends on the oversize of the electrically inactive zones. This enables an asymmetry of the electrically inactive zones which changes over the length of the piezostack to be compensated for.

BRIEF DESCRIPTION OF THE DRAWINGS

The invention is explained in more detail below on the basis of two figures.

DETAILED DESCRIPTION OF THE PREFERRED EMBODIMENTS

Figure 1:
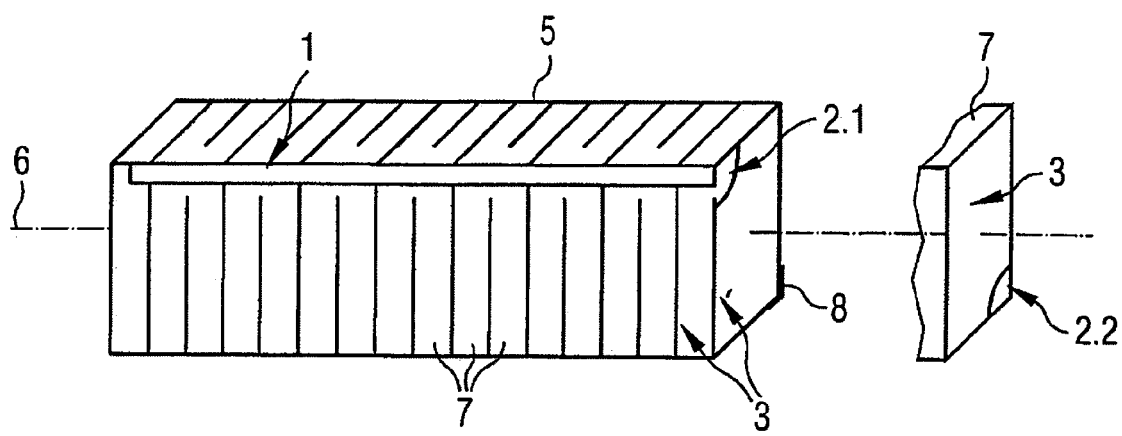
FIG. 1 shows the basic structure of a piezostack in a three-dimensional view.

The piezostack 5 in its initial form, as shown in principle in FIG. 1, is basically produced and constructed as described in steps one through fourteen in the introduction to this Description. The piezostack 5 features a plurality of ceramic layers 7, both sides or which are provided with an electrically active zone, designated below as the internal electrode 3. In addition the ceramic layers 7 also feature electrically inactive zones 2. FIG. 1 shows an electrically inactive zone 2.1 of an nth ceramic layer and an electrically active zone 2.2 of an n+1th ceramic layer. On the edges of the piezostack 5, on which the electrically inactive zones 2, 2.1, 2.2 are arranged there is an external metallization 1 or outer conductor which serves to interconnect the electrically active zones 3. The electrically inactive zones 2, 2.1, 2.2 are used, as already previously mentioned, so that not all electrically active zones 3 are electrically interconnected via the external conductor 1. The two external metallizations 1, 8 are arranged on opposite corner areas of the piezostack 5. The active zones 3 are connected alternately to one of the two external metallizations 1, 8. By application of different voltages to the two external metallizations 1, 8 an electrical field is applied to the ceramic layer 7 which is delimited by the two zones 3. Depending on the electrical field the ceramic layer 7 expands or contracts. All ceramic layers 7 behave in a corresponding way, resulting in either the expansion or contraction of the piezostack 5 itself. FIG. 1 shows an example of this. Only each second electrically active zone 3 of one side of the piezostack is connected to the same external conductor 1, 8.

Figure 2:
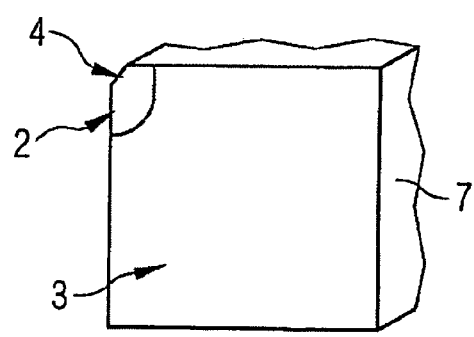
FIG. 2 shows a layer of the piezostack viewed from above.

When the multilayer ceramic wafer is separated or sawn into a number of piezostacks and the piezostacks are ground down to their required dimensions, because of the manufacturing tolerances involved, an asymmetry with regard to the electrically inactive zones 2.1, 2.2 usually arises. This means that either one edge or the other edge on which the electrically inactive zones 2.1, 2.2 are arranged features electrically inactive zones 2.1, 2.2 of different sizes. To remove this asymmetry the edge on which the larger electrically inactive zones 2.1, 2.2 are located is provided with a chamfer 4, so that the length and width of the electrically inactive zones 2.1, 2.2 is reduced. The result of this processing is shown in FIG. 2.

If the stacks are not sawn precisely at right angles a differing distribution of the asymmetry is produced over the length of piezostack 5. It can be that there is no asymmetry at one end of piezostack 5 and significant asymmetry at the other end. This can be countered when grinding off the edge by giving the chamfer 4 produced when the edge is ground away a profile which differs over the length of the piezostack 5. This means that no chamfer 4 is made on the side on which there is no error present and the size of the chamfer 4 increases towards the side on which the asymmetry is significant.

The chamfer angle can be selected so that the asymmetry is further reduced.

It is also possible to apply a chamfer 4 to each of the diagonally opposite edges of the piezostack on which the electrically inactive zones 2.1, 2.2 are arranged so that the electrically inactive zones 2, 2.1, 2.2 have the same dimensions.

In respect of manufacturing costs it would seem to be better however just to make one chamfer 4 on the piezostack 5 so as to dispense with a second grinding operation.

The electrically inactive zones are calibrated by an optical method and digital image processing. The asymmetry is computed from the measured values obtained. This is done by using a camera to record the outside surfaces of piezostack 5 and by feeding the images into a digital image processing unit. Since the images delivered by the camera show the length and the position of the internal electrodes 3 of the piezostack 5, these values can be used to assess the side of the piezostack 5 on which the larger electrically inactive zones are present. A camera image of the piezostack 5 in cross section is thus not required. To determine the asymmetry sufficiently accurately it is enough to know the dimensions which can be detected from the exterior of the piezostack 5, preferably the width of the electrically inactive zones 2, 2.1, 2.2 or the electrically active zones 3. The dimensions of the electrically inactive zones 2, 2.1, 2.2 can be deduced from the dimensions of the electrically active zones 3.

After the asymmetry has been removed, the external metallization 1, 8 is applied to the piezostack 5.

The arrangement of the external conductors 1, 8 of the electrically inactive zones 2, 2.1, 2.2 as well as of the electrically active zones 3 is only shown as an example in the Figures. Depending on the application, the external conductors 1, 8, the electrically inactive zones 2, 2.1, 2.2 and also the electrically active zones 3 can be arranged in any other way as required. This does not depart from the framework of the invention.

I claim:

1. A method for producing a piezostack, said method comprising:
   determining, for a piezostack with electrically inactive zones arranged on multiple sides of the piezostack, the asymmetry of the electrically inactive zones via optical measurement, and
   reducing a larger electrically inactive zone to a suitable proportion of the asymmetry.

2. A method in accordance with claim 1, wherein to determine the asymmetry of the electrically inactive zones the electrically inactive zones are measured.

3. A method in accordance with claim 1, wherein to determine the asymmetry, the width of the electrically inactive zones is taken into account.

4. The method in accordance with claim 1, wherein digital image processing is employed for the optical measurement.

5. The method in accordance with claim 1, wherein the reducing step is undertaken by grinding.

6. A method in accordance with claim 1, wherein an edge of the piezostack on which the electrically inactive zones of the piezostack are located is ground off.

7. A method in accordance with claim 1, wherein the reducing step creates a chamfer.

8. A method in accordance with claim 7, wherein an angle of the chamfer can be set.

9. A method in accordance with claim 1, wherein over the length of an edge of a piezostack the chamfer is created with a specific profile.

10. A method in accordance with claim 1, wherein external metallizations are applied to the piezostack to alternately connect consecutive electrically active zones to each other.

* * * * *